United States Patent [19]
Geffken et al.

[11] Patent Number: 5,883,435
[45] Date of Patent: Mar. 16, 1999

[54] PERSONALIZATION STRUCTURE FOR SEMICONDUCTOR DEVICES

[75] Inventors: Robert Michael Geffken, Burlington; William Thomas Motsiff; Ronald R. Uttecht, both of Essex Junction, all of Vt.

[73] Assignee: International Business Machines Corporation, Armonk, N.Y.

[21] Appl. No.: 686,899

[22] Filed: Jul. 25, 1996

[51] Int. Cl.[6] .............................. H01L 23/48; H01L 23/52
[52] U.S. Cl. .................. 257/758; 257/734; 257/737; 257/779; 257/780
[58] Field of Search ................................ 257/734, 737, 257/738, 778, 779, 780, 781, 795

[56] References Cited

U.S. PATENT DOCUMENTS

| | | | |
|---|---|---|---|
| 5,093,279 | 3/1992 | Andreshak et al. | 437/173 |
| 5,244,837 | 9/1993 | Dennison | 437/195 |
| 5,436,412 | 7/1995 | Ahmad et al. | 174/265 |
| 5,438,166 | 8/1995 | Carey et al. | 174/261 |

OTHER PUBLICATIONS

Bartlett, C., "Multichip Packaging Design for VLSI–Based Systems", *IEEE Transactions on Components, Hybrids and Manufacturing Technology*, vol. CHMT–12, No. 4, Dec. 1987, pp. 647–653.

Cronin, J.E., "Method for Elimination of Scratches in Polished Damascene Conductors", *Research Disclosure*, Feb. 1991, Number 322, Kenneth Maso Publications, Ltd. England.

Heinen, et al., "Multichip Assembly with Flipped Integrated Circuits", *IEEE Transactions on Components, Hybrids and Manufacturing Technology*, vol. 12, No. 4, Dec. 1989, pp. 650–657.

Miller, "Controlled Collapse Reflow Chip Joining", *IBM Res. Develop.*, pp. 239–250.

*Primary Examiner*—Carl W. Whitehead, Jr.
*Attorney, Agent, or Firm*—Schmeiser, Olsen & Watts; Mark F. Chadurjian

[57] ABSTRACT

The preferred embodiment of the present invention provides a structure and method for personalizing a semiconductor device in the context of a bump array connection to packaging, substrates and such. The preferred embodiment method uses a plurality of conduction lines on said semiconductor device, including a plurality of landing lines and personalization lines. Vias are opened to the plurality of landing lines and selectively opened to a portion of the personalization lines. Connections are made between the opened personalization lines with bumps deposited as part of the bump array.

11 Claims, 8 Drawing Sheets

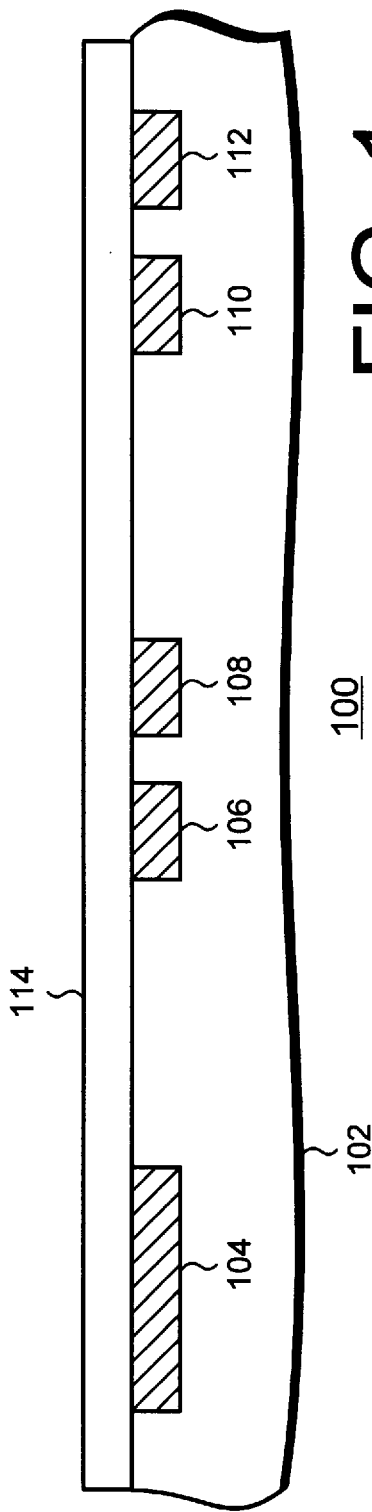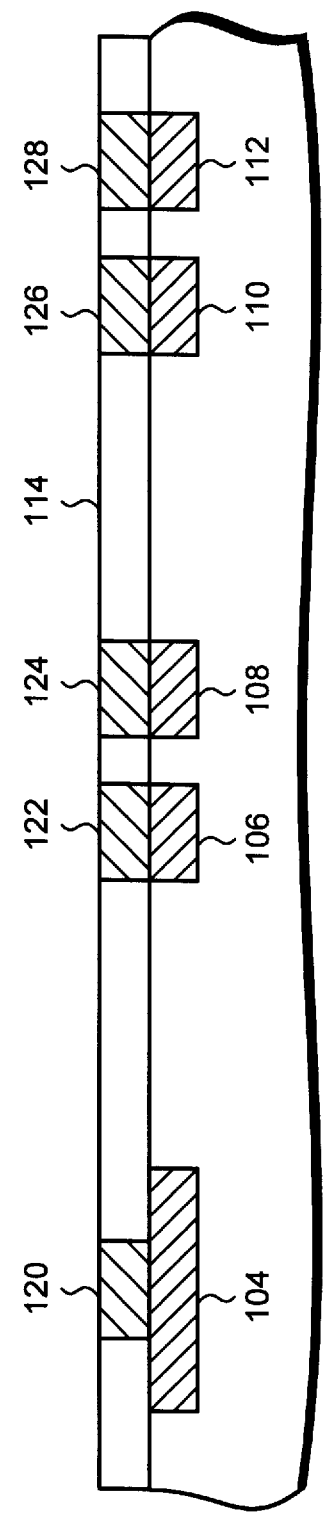

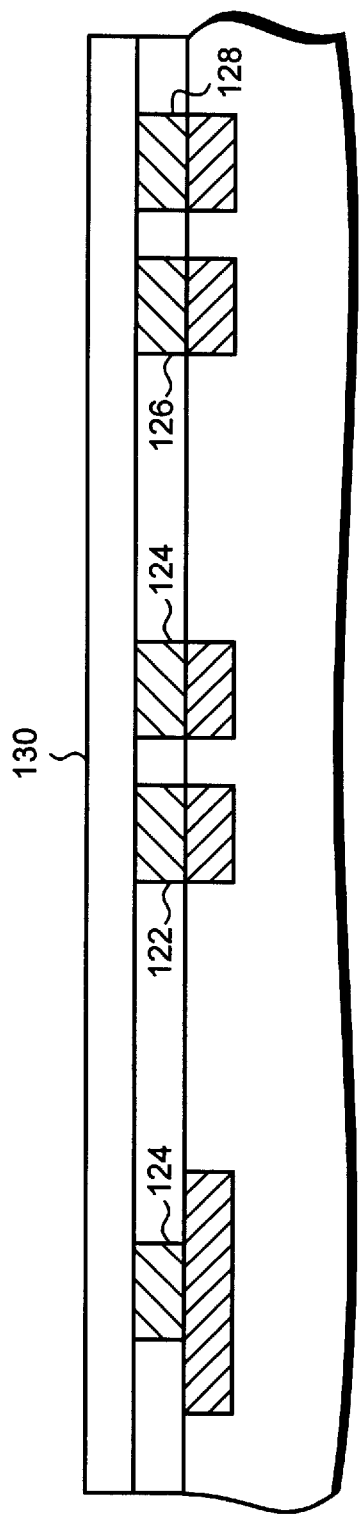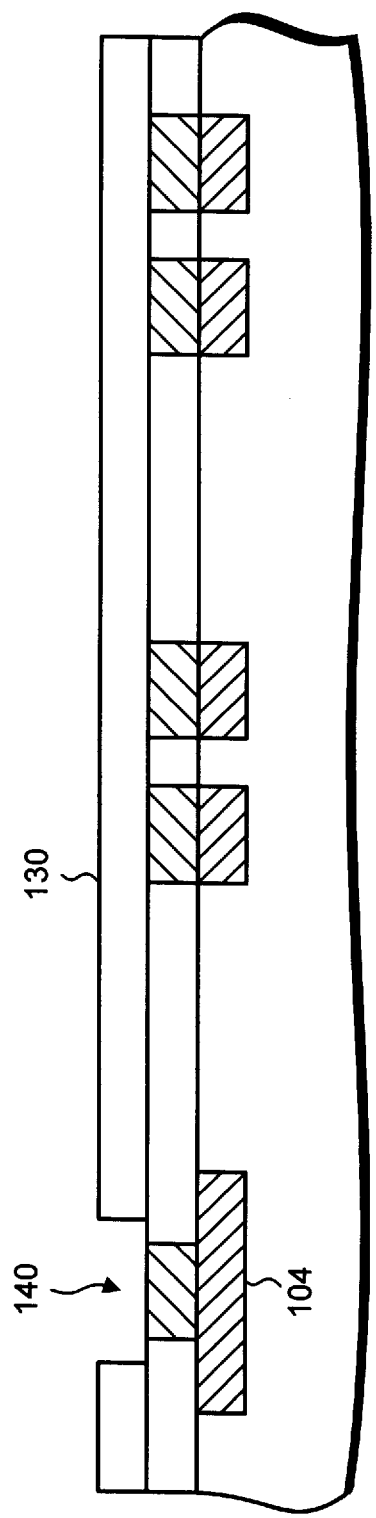

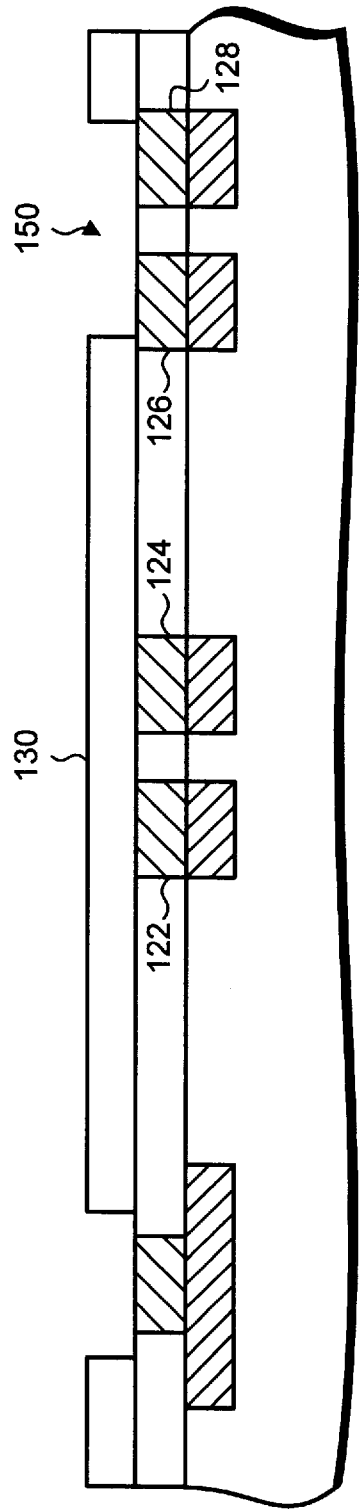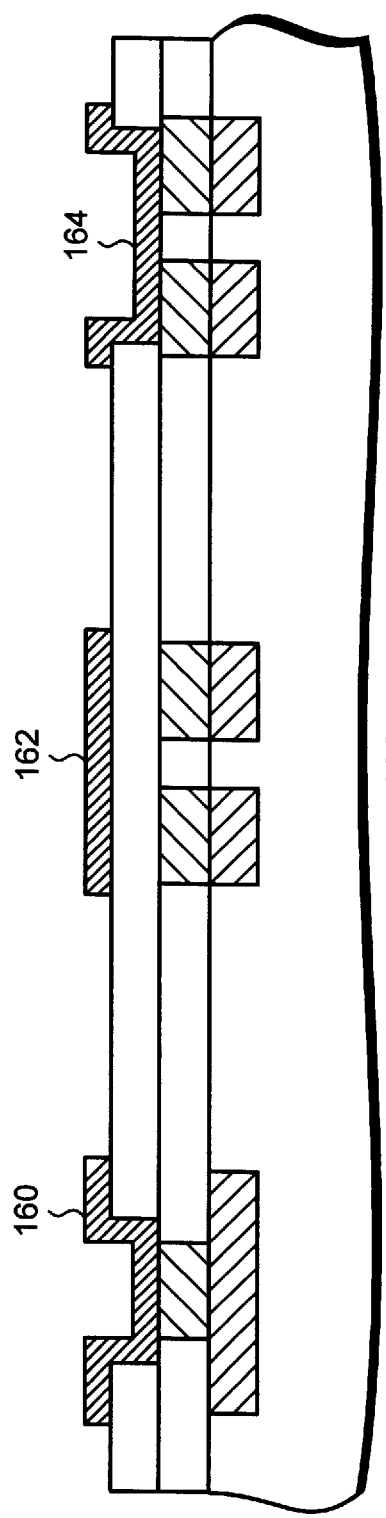

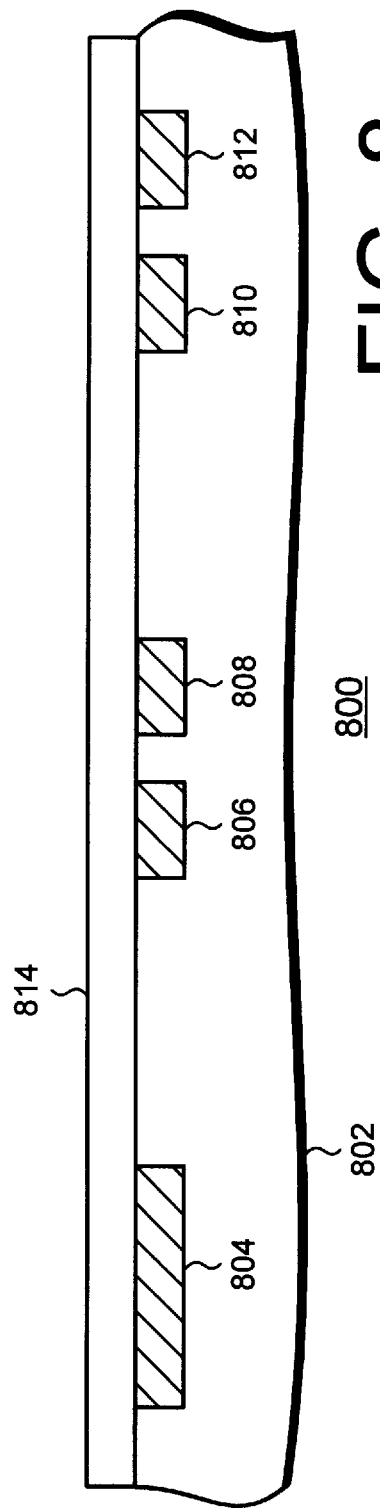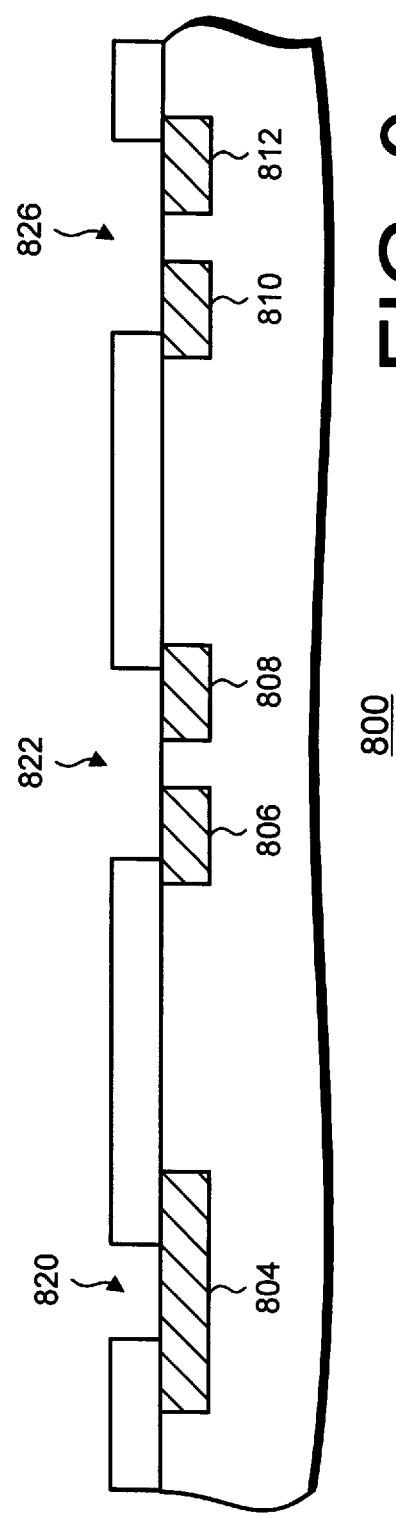

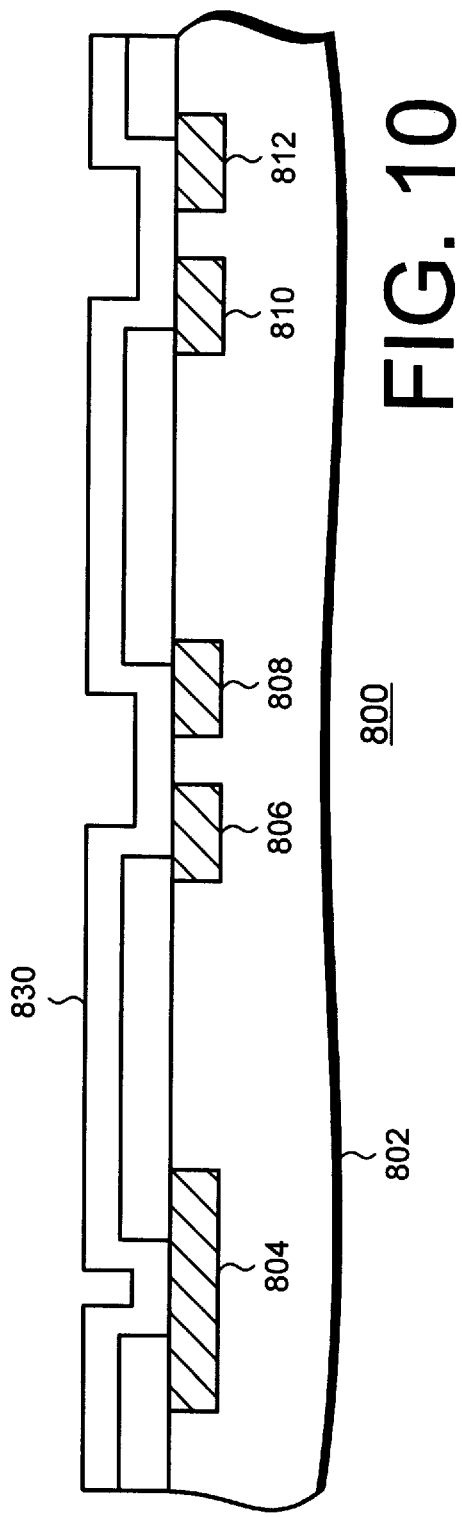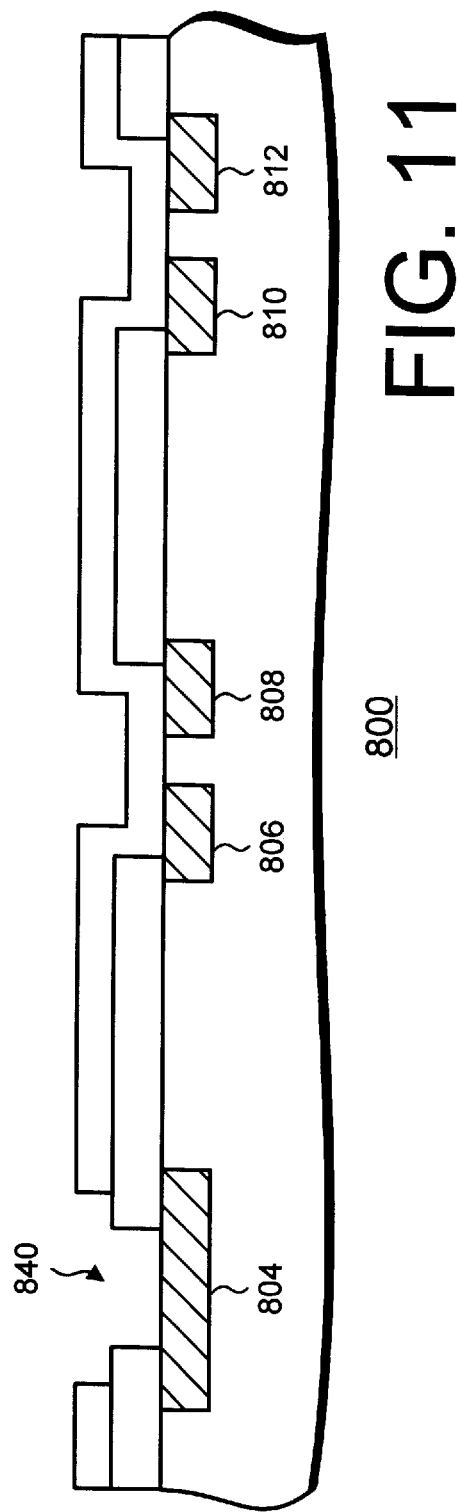

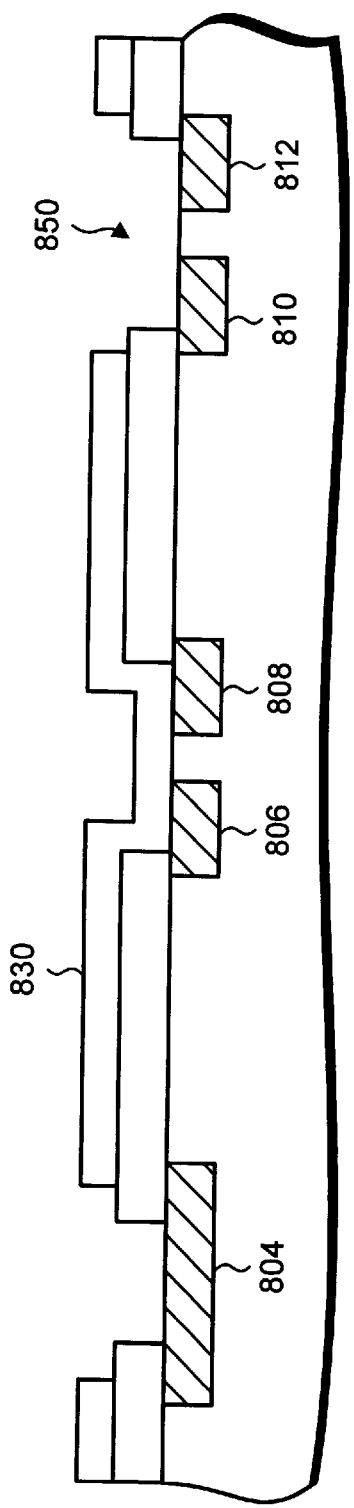
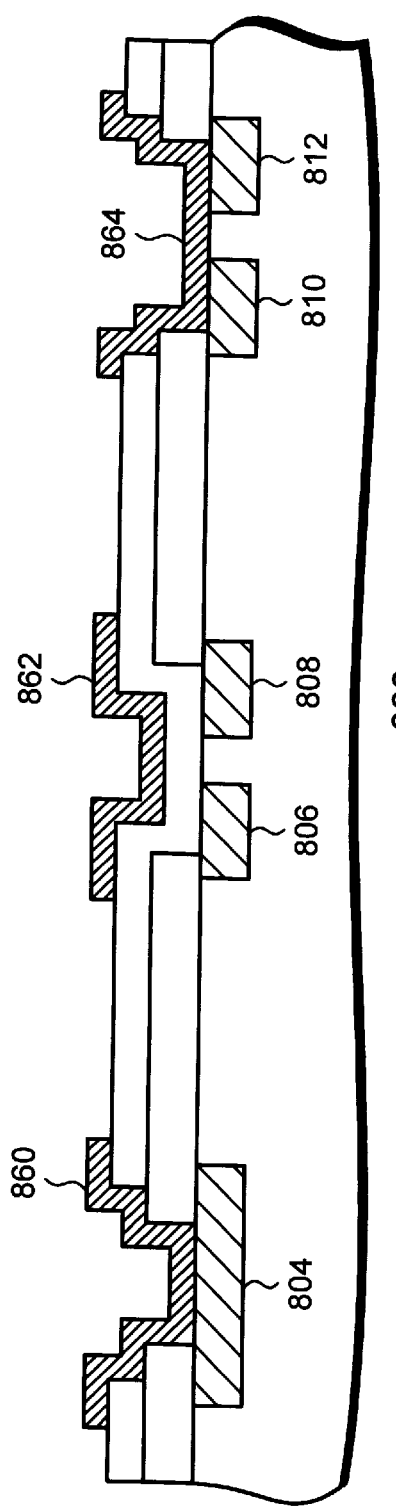

PERSONALIZATION STRUCTURE FOR SEMICONDUCTOR DEVICES

BACKGROUND OF THE INVENTION

1. Technical Field

This invention generally relates to semiconductor circuit fabrication, and more specifically relates to programming structures in semiconductor devices.

2. Background Art

The proliferation of electronics in our modern world is in large part due to integrated circuit semiconductor devices. Integrated semiconductor devices are designed and used for widely differing applications. For this reason it is often beneficial to have the ability to "personalize" a semiconductor device during fabrication. For example, many large scale integrated circuits use built in redundancy as a method of improving fabrication yield. In a device such as a dynamic random access memory (DRAM) fuse links are a well known redundancy technique. The fuse links are used to access spare bit lines and/or word lines to increase yield. Typically, the semiconductor device is built and then tested. Some types of flaws in the device, such as bad bit lines in a DRAM, can be bypassed by blowing an appropriate fuse link which disconnects the defective circuit.

Device customization is another reason to personalize a semiconductor circuit. Customization involves changing the structure of the semiconductor device to meet specific needs. Often, it is not cost effective to create separate fabrication lines, with different masks and such, for each small change in the device. For this reason, specific customization techniques are used to personalize the device, i.e., to make specific changes in the device to meet a particular need. Some customization techniques use fuse links to customize a device for a particular need. For this, some of the available fuses are blown by a laser or other means to make customized changes to the device.

Unfortunately, the use of fuse links for device personalization has inherent limitations. Specifically, the fuse link can only be blown open or left closed. The fuse link cannot be used to make a previously open circuit closed. In particular, fuse links can only be used to open a selected circuit; they cannot be used to connect conductors in the device. This limits the type of personalization that can be easily accomplished. For this reason, the use of fuse links in semiconductor personalization is limited.

Therefore, there existed a need to provide an improved structure and method for semiconductor device personalization. Specifically a need existed for a structure and method that allows circuit connections to be made as part of a device personalization.

DISCLOSURE OF INVENTION

According to the present invention, a structure and method for personalizing a semiconductor device is provided in the context of a bump array connection to packaging, substrates and such. The present invention uses a plurality of conduction lines on the semiconductor device, including a plurality of landing lines and personalization lines. Vias are opened to the plurality of landing lines and selectively opened to a portion of the personalization lines. Connections are made between the opened personalization lines with bumps deposited as part of the bump array. The present invention thus offers the feature of being easily integrated into bump array connection procedures.

The foregoing and other features and advantages of the invention will be apparent from the following more particular description of preferred embodiments of the invention, as illustrated in the accompanying drawings.

BRIEF DESCRIPTION OF DRAWINGS

The preferred exemplary embodiment of the present invention will hereinafter be described in conjunction with the appended drawings, where like designations denote like elements, and:

FIGS. 1–7 are cross sectional side views of a semiconductor portion in various process steps in accordance with a first embodiment; and FIGS. 8–14 are cross sectional side views of a semiconductor portion in various process steps in accordance with a second embodiment.

BEST MODE FOR CARRYING OUT THE INVENTION

Figure 7:
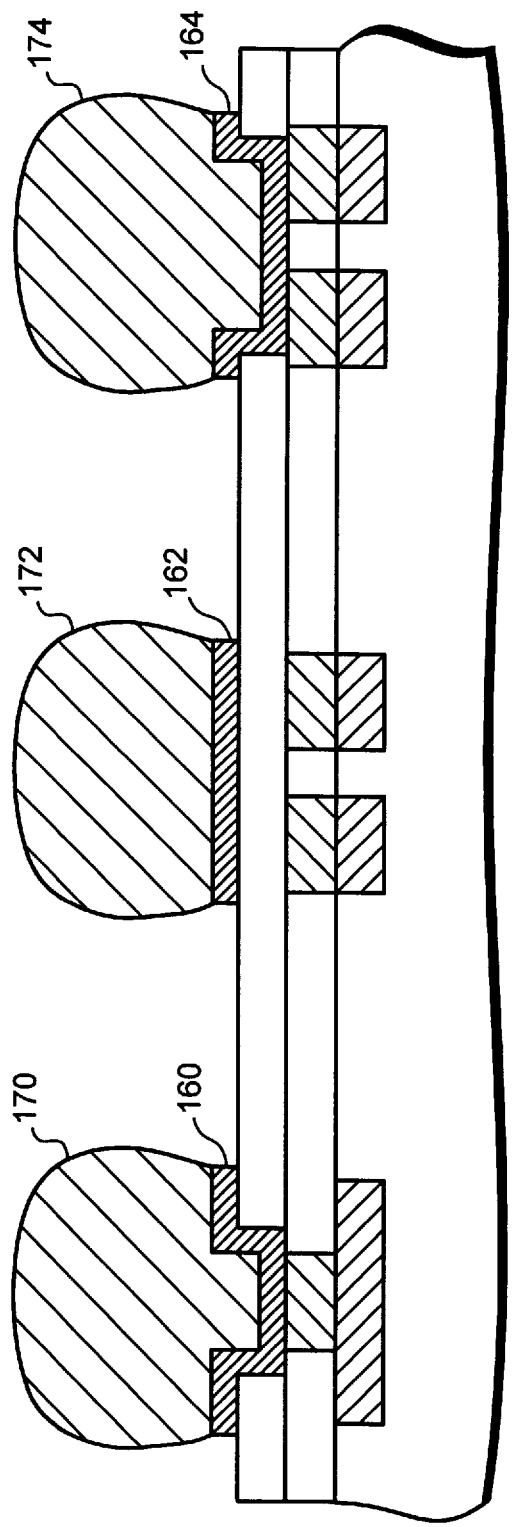

Many techniques exist for connecting integrated semiconductor devices, commonly referred to as "chips" to various substrates, modules, and other chips, generally referred to as "packaging." For example, wire bonding is a well known method of connecting semiconductor devices to other structures.

In standard wire bonding, landing pads are provided around the perimeter of the integrated semiconductor device and wire is connected from the landing pads to appropriate places on the packaging structure. Unfortunately, because the space around the perimeter of the semiconductor device is often limited, a limited number of wire bonds can be connected to a given device.

Another method for connecting semiconductor devices to a package uses bump arrays. To use bump array structures, an array of landing wires are provided on the semiconductor device. These landing wires are generally part of the last metal layer interconnects on the semiconductor device, and comprise metals such as aluminum (Al) and copper (Cu). An intermediate layer is deposited on the landing wires and an array of conducting bumps are deposited on the covered landing wires. These conducting bumps generally comprise a lead tin alloy (PbSn) and are commonly referred to as solder bumps. The integrated semiconductor devices are then flipped over and placed so that the array of solder bumps is aligned with a corresponding array of contacts on the packaging. The device is then heated, allowing the solder bumps to partially melt and join the semiconductor device to the packaging.

The bump array thus serves as both the electrical connection from the integrated device to the packaging and the mechanical means for holding the device to the packaging. Because the solder bumps are arrayed across the entire surface of the semiconductor device, the number of connections made to the packaging can be increased without increasing device size.

One particular method using bump arrays as component interconnects is described by L. F. Miller in "Controlled Collapse Reflow Chip Joining," IBM J. Res. Develop., Vol 13, 3:239–269 (May 1969). The method disclosed there uses a connection bump, generally called a "controlled collapse chip connection" bump or a C4 bump, that is capable of "wetting" to a substrate or packaging land and a transition layer on the semiconductor device. In wetting, the connection bump partially melts and makes mechanical and electrical contact to the substrate and transition layer, and hence the semiconductor device.

The preferred embodiment of the present invention provides an improved method and structure for semiconductor device customization that is easily integrated into bump array connection methods. Referring to the figures generally, FIGS. 1–7 illustrate a first embodiment of the present invention preferable for use with copper interconnect wiring and FIGS. 8–14 illustrate a second embodiment preferable for use with aluminum interconnect wiring.

Turning now to FIG. 1, FIG. 1 is a schematic cross sectional view of a integrated semiconductor device 100. The semiconductor portion 100 will be used to illustrated a first embodiment of the present invention. The semiconductor portion 100 includes a dielectric portion 102, landing wire 104 and personalization wires 106, 108, 110 and 112. The dielectric portion 102, landing wire 104, and personalization wires 106, 108, 110 and 112 are all preferably deposited as part of the interconnect wiring, where various levels of metal, surrounded by isolating dielectric, are deposited to connect to the various underlying semiconductor devices. The preferred method of depositing the various interconnects, including landing wire 104 and personalization wires 106, 108, 110 and 112, is damascene metal processing. Specifically, for the embodiment illustrated in FIGS. 1–7 the landing wire 104 and personalization wires 106, 108, 110 and 112 preferably comprise damascene defined copper. Of course other suitable conducting materials can be used.

The dielectric portion 102 can comprise any suitable dielectric e.g., silicon dioxide or silicon nitride. The landing wire 104 and personalization wires 106, 108 110 and 112 are preferably deposited as part of the last interconnect metal layer, but may be suitably formed in other manufacturing steps as well, such as in earlier metal layers. As part of the semiconductor devices, landing wire 104 and personalization wires 106, 108 110 and 112, are connected to earlier interconnect levels and eventually to the underlying semiconductor devices (not shown in FIGS.).

As will become clear, the landing wire 104 is preferably connected to the underlying semiconductor device to facilitate a connection to device packaging, as part of a bump array connection. Personalization wires 106 and 108 are preferably connected to portions of the underlying semiconductor device that can be either connected or left unconnected to personalize the semiconductor device for a particular need. Likewise, personalization wires 110 and 112 are preferably connected to portions of the underlying semiconductor device that can be either connected or left unconnected to personalize the semiconductor device for a particular need.

A dielectric layer 114 is deposited atop the dielectric 102, landing wire 104 and personalization wires 106, 108, 110 and 112. The dielectric layer 114 is preferably silicon dioxide (SiO$_2$) or a silicon dioxide/silicon nitride (SiO$_2$/Si$_3$N$_4$) sandwich, but other suitable dielectric materials can be used.

Turning now to FIG. 2, the next step in the first embodiment is to create contacts to the landing wires and personalization wires on the semiconductor device. Thus, contacts are formed to landing wire 104 and personalization wires 106, 108, 110 and 112. This is preferably done using damascene processing. The first step in creating damascene contacts is to open a via for each contact. The vias are opened through dielectric 114 above each landing wire and set of personalization wires. These vias are preferably opened using conventional photolithography and reactive ion etching, but other suitable methods can be used.

A damascene deposition then fills the opened via with a conductor such as titanium tungsten (TiW). The surface is then planerized using a chemical mechanical process or other equivalent. This results in the structure shown in FIG. 2, with contacts 120, 122, 124, 126, and 128 above landing wire 104 and personalization wires 106, 108, 110 and 112, respectively. Of course, other suitable fabrication methods can be used to fabricate contacts 120, 122, 124, 126, and 128, with other suitable conductor materials. As will become clear, the contacts protect the underlying wires from being damaged during the opening of personalization vias. This protection is necessary where the wires comprise a material such as copper that is prone to oxidation.

Turning now to FIG. 3, the next step is to deposit a dielectric layer 130 over the contacts 120, 122, 124, 126, and 128. Generally the dielectric layer is deposited over the entire semiconductor device. The dielectric layer 130 comprises dielectric material that can be selectively opened. Preferably, the dielectric layer 130 comprises a high performance organic dielectric material such as polyimide. Vias can be opened in polyimide using laser ablation as well as standard photolithography.

Turning now to FIG. 4, the next step after curing the dielectric layer 130 is to open vias in the dielectric layer 130 using standard techniques, such as photo lithography. Standard techniques such as photolithography allow multiple vias to be opened in one fabrication step. However, these techniques requires the use of masks and other components that must be specially fabricated. Thus, these techniques are not cost effective to make personalization vias in relatively few devices. Thus, at this step vias are opened to the contacts that are to be connected in all versions of the semiconductor device. For example, vias such as via 140 are opened to contacts above landing wires such as landing wire 104 for use in connecting the semiconductor device to packaging. This facilitates conventional bump array connections to packaging.

Vias to contacts above some personalization wires can also be opened at this step, but it is generally only cost effective to do so where a large number of devices with a particular personalization are going to be needed. Otherwise the cost of producing the required specialized masks makes it uneconomical.

Turning now to FIG. 5, the next step is to open personalization vias such as personalization via 150 in the dielectric layer 130. The personalization vias are preferably fabricated using a cost effective technique that can be easily modified from one fabricated device to the next. For example, laser ablation using a computer controlled laser with an appropriate wavelength can be used to selectively open personalization vias in suitable dielectric materials such as polyimide. Selectively opening vias to various combinations of contacts above personalization wires a semiconductor device facilitates the easy personalization of the device. In the example of FIGS. 1–7, a personalization via 150 is opened to contacts 126 and 128 while contacts 122 and 124 remain isolated. In the preferred embodiment, this is the only step where fabrication changes must be made to personalize the device.

Turning now to FIG. 6, the next step is to deposit a conductive transition layer over each contact. In the illustrated example transition layers 160, 162 and 164 are deposited over the various contacts. The transition layer serves as a mechanically strong bonding layer to semiconductor device. In particular the transition layer prevents the bumps in the array from moving horizontally as they are heated. The transition layer also serves as a barrier layer to keep the bump array material from reacting with the underlying metallurgy. For example, the preferred transition layer comprises a sandwich of chrome, copper and gold with a transition phase of chrome/copper between the chrome and copper. Of course, other suitable materials can be used such as TiCuAu or TiNiCuAu.

Because vias were opened to their underlying contacts, transition layers 160 and 164 form an electrical contact to the contacts underneath. Conversely, transition layer 162 is isolated from the contact beneath. Preferably the transition layers extend beyond the opened vias to improve the mechanical bond between the transition layer and the semiconductor device.

Turning now to FIG. 7, the next step is to deposit a bump array on the semiconductor device, with a bump deposited on each transition layer. In the illustrated embodiment a bump 170, 172 and 174 is deposited on transition layers 160, 162 and 164 respectively. The bump array typically comprises an array of lead tin (PbSn) solder bumps, as is well known in semiconductor to packaging wiring. The bumps are preferably deposited in all points on the array including on all landing wires and personalization wires, whether or not a personalization connection was made to the underlying personalization wires. Thus the step of depositing the bump array does not need to be modified for a particular personalization.

Where the personalization wires were exposed by creating personalization vias, such as via 150 above personalization wires 110 and 112, the bump 174 in combination with the transition layer 164 will serve to connect the two personalization wires 110 and 112 together. Conversely, where a via was not created, as in the case of personalization wires 106 and 108, the wires remain isolated from each other. Thus by selectively opening personalization vias the semiconductor device is customized, with no other changes made in the fabrication process.

The solder bumps above personalization wires need not be connected to anything on the semiconductor packaging. However, if needed for a particular purpose these bumps can be connected, allowing the two personalization wires to serve as inputs or outputs for the underlying semiconductor devices.

Those skilled in the art will recognize that various changes can be made in the embodiment illustrated in FIGS. 1–7 without departing from the scope of this invention.

Turning now to FIGS. 8–14, a second embodiment of the present invention is illustrated. FIG. 8 is a schematic cross sectional view of a integrated semiconductor device 800. The semiconductor portion 800 will be used to illustrated a second embodiment of the present invention. The portion 800 includes an dielectric portion 802, landing wire 804 and personalization wires 806, 808, 810 and 812. The dielectric portion 802, landing wire 804 and personalization wires 806, 808, 810 and 812 are all preferably deposited as part of the interconnect processing, where various levels of metal, surrounded by isolating dielectric, are deposited to connect to the various underlying semiconductor devices. Specifically, for the embodiment illustrated in FIGS. 8–14 the landing wire 804, personalization wires 806, 808, 810 and 812 preferably comprise aluminum interconnects. Of course other suitable conducting materials can be used such as tungsten or gold.

The dielectric portion 802 can comprise any suitable dielectric e.g., silicon dioxide or silicon nitride. The landing wire 804 and personalization wires 806, 808, 810 and 812 are preferably deposited as part of the last interconnect metal layer, but are suitably formed in other manufacturing steps, such as in earlier metal layers. As part of the semiconductor devices, landing wire 804 and personalization wires 806, 808, 810 and 812, are connected to earlier interconnect levels and eventually to the underlying semiconductor devices (not shown in FIG.).

A dielectric layer 814 is deposited above the landing and personalization wires on the semiconductor device. The dielectric layer 814 is preferably silicon dioxide ($SiO_2$) or a silicon dioxide/silicon nitride ($SiO_2/Si_3N_4$) sandwich, but other suitable dielectric materials can be used.

Turning now to FIG. 9, the next step in this embodiment is to open vias through dielectric layer 814 to the underlying landing wires and personalization wires. In the illustrated embodiment, a via 820 opened to landing wiring, a via 822 opened to personalization wires 806 and 808, and a via 826 opened to personalization wires 810 and 812.

Turning now to FIG. 10, the next step is to deposit a dielectric layer 830 over the semiconductor portion 800 and in vias 820, 822 and 826. This dielectric layer 830 comprises dielectric material that can be selectively opened. Thus, again the dielectric layer 830 preferably comprises a high performance organic dielectric material such as polyimide. Vias can be opened in polyimide dielectrics using laser ablation as well as standard photolithography.

Turning now to FIG. 11, the next step is to open vias in the dielectric layer 830 using standard techniques, such as photolithography. Again, standard techniques such as photolithography allow multiple vias to be opened in one fabrication step. For example, vias such as via 840 are opened to landing wires such as landing wire 804 for use in connecting the semiconductor device to packaging. This facilitates conventional bump array connections to packaging.

Vias to contacts above some personalization wires can also be opened at this step, but again it is generally only cost effective to do so where a large number of devices with a particular personalization is going to be needed.

Turning now to FIG. 12, the next step is to open personalization vias such as personalization via 850 in the dielectric layer 830. The personalization vias are preferably fabricated using a cost effective technique that can be easily modified from one fabricated to device to the next. Again, laser ablation using a computer controlled laser with an appropriate wavelength can be used to selectively open personalization vias in suitable dielectric materials such as polyimide. In the example of FIGS. 8–14, personalization via 850 was opened to personalization wires 810 and 812 while personalization wires 806 and 808 remain isolated. Again, in the preferred embodiment, this is the only step where fabrication changes must be made to personalize the device.

Turning now to FIG. 13, the next step is to deposit a transition layer over each landing wire and set of personalization wires. In the illustrated example transition layers 860, 862 and 864 are deposited over landing wire 804, personalization wires 806 and 808, and personalization wires 810 and 812 respectfully. Again, the transition layers serves as a mechanically strong bonding layer to semiconductor device, as well as a barrier layer to keep the bump array material from reacting with the underlying metallurgy. The transition layers are particularly critical in the second embodiment where tungsten above the wires is omitted. Otherwise, the lead tin bumps would react with the underlying aluminum wire and create excessive contact resistance.

Again, suitable materials for transition layers 860, 862 and 864 include a sandwich of chrome, copper and gold with a transition phase of chrome/copper between the chrome and copper. Because vias were opened to their underlying wires, transition layers 860 and 864 form an electrical contact to the wires underneath. Conversely, transition layer 862 is isolated from the wire underneath it.

Preferably the transition layers extend beyond the opened vias to improve the mechanical bond between the transition layer and the semiconductor device.

Figure 14:
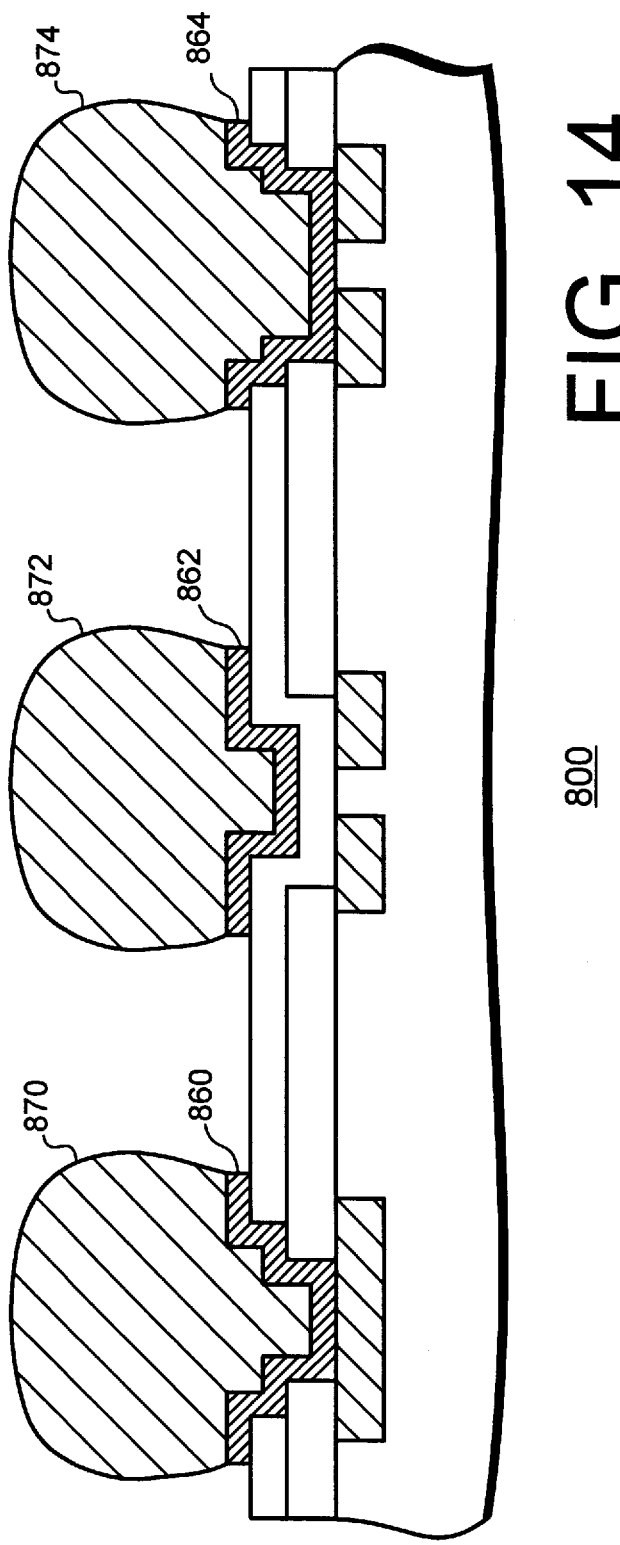

Turning now to FIG. 14, the next step is to deposit a hump array on the semiconductor device, with a bump deposited on each transition layer. Where the personalization wires were exposed by creating personalization vias, such as via 850 above personalization wires 810 and 812, the bump along with the transition layer 864 will serve to connect the two personalization wires 810 and 812 together. Conversely, where a via was not created, as in the case of personalization wires 806 and 808, the wires remain isolated from each other. Thus by selectively opening personalization vias the semiconductor device is customized, with no other changes made in the fabrication process.

Those skilled in the art will recognize that various changes can be made in the embodiment illustrated in FIGS. 8–14, without departing from the scope of this invention.

While the invention has been particularly shown and described with reference to preferred exemplary embodiments thereof, it will be understood by those skilled in the art that variations in form and detail may be made therein without departing from the spirit and scope of the invention.

We claim:

1. A personalization structure for personalizing a semiconductor device comprising:
   a) a plurality of conduction lines connecting to said semiconductor device, said plurality of conduction lines including a plurality of landing lines and including a plurality of personalization line sets, wherein each personalization line set comprises at least two personalization lines in relatively close proximity to each other, wherein said at least two personalization lines are each connected to said semiconductor device such that a connection between at least two personalization lines personalizes said device;
   b) an insulator layer formed over said plurality of conduction lines;
   c) a plurality of vias opened through said insulator layer to said plurality of landing lines;
   d) at least one via opened through said insulator layer to at least one of said plurality of said personalization line sets; and
   e) an array of connection bumps over said plurality of conduction lines; said array of connection bumps including at least one connection bump forming an connection to said at least one of said plurality of landing lines and at least one connection bump forming a connection between one of said sets of personalization lines.

2. The personalization structure of claim 1 wherein said insulator layer comprises an insulator layer capable of having vias opened in said insulator layer by laser ablation without damaging said semiconductor device.

3. The personalization structure of claim 2 wherein said insulator layer comprises polyimide.

4. The personalization structure of claim 1 wherein said at least one via opened to at least one of said plurality of personalization line sets is opened using laser ablation.

5. The personalization structure of claim 1 further comprising an array of transition layers formed between said array of connection bumps and said plurality of conduction lines.

6. The personalization structure of claim 1 wherein said array of device connection bumps comprise an array of controlled collapse chip connection bumps.

7. The personalization structure of claim 1 further comprising transition layers atop said plurality of conduction lines.

8. The personalization structure of claim 1 further comprising contacts deposited above each of said landing lines and each of said personalization lines and wherein said plurality of vias opened to said plurality of landing lines and said at least one via opened to said at least one of said plurality of personalization line sets comprise vias opened to said contacts.

9. The personalization structure of claim 1 wherein said conduction lines comprise copper.

10. The personalization structure of claim 1 wherein said conduction lines comprise aluminum.

11. The personalization structure of claim 1 wherein said conduction lines are formed as part of interconnect wiring for the semiconductor device.

* * * * *